(12) United States Patent
Sinclair et al.

(10) Patent No.: US 9,960,730 B2
(45) Date of Patent: ***May 1, 2018

(54) SELF-BALLASTED APPARATUS FOR SOLAR TRACKING

(71) Applicant: Morgan Solar Inc., Toronto (CA)

(72) Inventors: Michael Sinclair, Toronto (CA); John Paul Morgan, Toronto (CA); Philip M. Chang, Scarborough (CA); Dhanushan Balachandreswaran, Richmond Hill (CA); Abdelkader Chellabi, Richmond (CA); Porter Arbogast, Covina, CA (US); Richard Iannello, La Canada, CA (US)

(73) Assignee: MORGAN SOLAR INC., Toronto (CA)

( * ) Notice: Subject to any disclaimer, the term of this patent is extended or adjusted under 35 U.S.C. 154(b) by 0 days. days.

This patent is subject to a terminal disclaimer.

(21) Appl. No.: 14/619,858

(22) Filed: Feb. 11, 2015

(65) Prior Publication Data

US 2015/0207453 A1 Jul. 23, 2015

Related U.S. Application Data

(63) Continuation of application No. 13/962,566, filed on Aug. 8, 2013, now Pat. No. 8,981,201, which is a
(Continued)

(51) Int. Cl.
*H01L 31/052* (2014.01)
*H02S 20/32* (2014.01)
(Continued)

(52) U.S. Cl.
CPC ............. *H02S 20/32* (2014.12); *F16M 11/00* (2013.01); *F16M 13/00* (2013.01); *F24J 2/38* (2013.01);
(Continued)

(58) Field of Classification Search
CPC ....... H01L 31/00–31/208; Y02E 10/50–10/60; H02S 20/00–20/32; H02S 30/00–30/20
(Continued)

(56) References Cited

U.S. PATENT DOCUMENTS 3,153,789 A 10/1964 Ashton
4,063,543 A 12/1977 Hedger
(Continued)

FOREIGN PATENT DOCUMENTS

DE 9101423 U1 7/1991
EP 4116894 A1 11/1992
(Continued)

OTHER PUBLICATIONS

McDonald et al., "Accurate Energy Predictions for Tracking HCPV Installations," presented at the 24th European Photovoltaic Solar Energy Conference, Sep. 21-25, 2009, pp. 1-6.
(Continued)

*Primary Examiner* — Bach T Dinh
(74) *Attorney, Agent, or Firm* — Jenna L. Wilson; Wilson Lue LLP

(57) ABSTRACT

A frame for mounting a plurality of solar tracking units is provided. The frame comprises a plurality of leg assemblies interconnected by trusses to provide a stable structure that is ballasted by the frame's own weight, rather than relying on external ballast such as concrete blocks. Each leg assembly is provided with a shaft with a mounting end for mounting a solar tracking unit. Each solar tracking unit includes an armature assembly and at least one motor for controlling the orientation and position of a solar panel mounted thereon. Solar tracking assemblies, each comprising the frame and plurality of solar tracking units, can be assembled in an array using connectors spacing the assemblies, thus providing enhanced stability. Each of the assemblies can be provided
(Continued)

with a local control unit for controlling each individual solar tracking unit, and a global control unit may be used to control the local control units.

18 Claims, 10 Drawing Sheets

Related U.S. Application Data continuation of application No. PCT/IB2012/052723, filed on May 30, 2012.

(60) Provisional application No. 61/523,817, filed on Aug. 15, 2011, provisional application No. 61/532,083, filed on Sep. 7, 2011.

(51) Int. Cl.
| | |
|---|---|
| H01L 31/00 | (2006.01) |
| F24J 2/38 | (2014.01) |
| F24J 2/52 | (2006.01) |
| F24J 2/54 | (2006.01) |
| H01L 31/042 | (2014.01) |
| F16M 11/00 | (2006.01) |
| F16M 13/00 | (2006.01) |
| H02S 30/10 | (2014.01) |
| H02S 20/10 | (2014.01) |
| H01L 31/054 | (2014.01) |

(52) U.S. Cl.
CPC .............. *F24J 2/523* (2013.01); *F24J 2/542* (2013.01); *H01L 31/00* (2013.01); *H01L 31/0422* (2013.01); *H02S 20/10* (2014.12); *H02S 30/10* (2014.12); *F24J 2002/5277* (2013.01); *H01L 31/054* (2014.12); *Y02E 10/47* (2013.01); *Y02E 10/50* (2013.01)

(58) Field of Classification Search
USPC .......... 136/243–265; 52/173.3; 126/569–713
See application file for complete search history.

(56) References Cited

U.S. PATENT DOCUMENTS

| | | | |
|---|---|---|---|
| 4,245,616 A | 1/1981 | Wyland | |
| 4,429,178 A | 1/1984 | Prideaux et al. | |
| 4,456,783 A | 6/1984 | Baker | |
| 4,572,161 A | 2/1986 | Mori | |
| 4,870,949 A | 10/1989 | Butler | |
| 4,968,355 A | 11/1990 | Johnson | |
| 5,169,456 A | 12/1992 | Johnson | |
| 5,851,309 A | 12/1998 | Kousa | |
| 6,304,376 B1 | 10/2001 | Baun et al. | |
| 6,392,799 B1 | 5/2002 | Baun et al. | |
| 6,498,290 B1 | 12/2002 | Lawheed | |
| 6,870,087 B1 | 3/2005 | Gallagher | |
| 6,958,868 B1 | 10/2005 | Pender | |
| 7,252,083 B2 | 8/2007 | Hayden | |
| 7,388,348 B2 | 6/2008 | Mattichak | |
| 7,554,030 B2 | 6/2009 | Shingleton | |
| 7,895,017 B2 | 2/2011 | McDonald et al. | |
| 7,905,227 B2 | 3/2011 | Luconi et al. | |
| 7,906,750 B2 | 3/2011 | Hickerman et al. | |
| 8,188,414 B2 | 5/2012 | Linke | |
| 8,981,201 B2* | 3/2015 | Sinclair ...................... | F24J 2/38 |
| | | | 136/243 |
| 2005/0217936 A1 | 10/2005 | Jolicoeur et al. | |
| 2007/0074756 A1* | 4/2007 | Yagiura ........... | H01L 31/035281 |
| | | | 136/244 |
| 2007/0217000 A1 | 9/2007 | Baun et al. | |
| 2007/0227574 A1 | 10/2007 | Cart | |
| 2007/0272234 A1 | 11/2007 | Allen et al. | |
| 2007/0272826 A1 | 11/2007 | Huang et al. | |
| 2008/0053032 A1 | 3/2008 | Hockemeyer et al. | |
| 2008/0236567 A1 | 10/2008 | Hayden | |
| 2008/0258051 A1 | 10/2008 | Heredia et al. | |
| 2009/0007901 A1* | 1/2009 | Luconi ................ | F24J 2/5239 |
| | | | 126/627 |
| 2009/0032089 A1 | 2/2009 | Chen et al. | |
| 2009/0107485 A1 | 4/2009 | Reznik et al. | |
| 2009/0159115 A1 | 6/2009 | Banin et al. | |
| 2009/0165782 A1 | 7/2009 | Hodges et al. | |
| 2009/0185302 A1 | 7/2009 | Forrester et al. | |
| 2009/0188487 A1 | 7/2009 | Jones et al. | |
| 2009/0194669 A1 | 8/2009 | Noble et al. | |
| 2009/0250095 A1 | 10/2009 | Thorley et al. | |
| 2009/0260619 A1* | 10/2009 | Bailey .................. | F24J 2/07 |
| | | | 126/578 |
| 2009/0261810 A1 | 10/2009 | Askins et al. | |
| 2009/0266395 A1 | 10/2009 | Murthy et al. | |
| 2010/0018518 A1 | 1/2010 | McDonald | |
| 2010/0023138 A1 | 1/2010 | McDonald et al. | |
| 2010/0043870 A1* | 2/2010 | Bennett ................ | H02S 40/34 |
| | | | 136/251 |
| 2010/0051017 A1 | 3/2010 | Xie et al. | |
| 2010/0059045 A1 | 3/2010 | Diaz et al. | |
| 2010/0126554 A1 | 5/2010 | Morgan et al. | |
| 2010/0154780 A1 | 6/2010 | Linke | |
| 2010/0185333 A1 | 7/2010 | Oosting | |
| 2010/0212653 A1 | 8/2010 | McDonald | |
| 2010/0213761 A1 | 8/2010 | McDonald et al. | |
| 2010/0263659 A9 | 10/2010 | Taylor et al. | |
| 2010/0263709 A1 | 10/2010 | Norman et al. | |
| 2010/0308206 A1 | 12/2010 | Tomlinson et al. | |
| 2011/0017276 A1 | 1/2011 | Boffa et al. | |
| 2011/0036342 A1 | 2/2011 | Allen et al. | |
| 2011/0041834 A1 | 2/2011 | Liao | |
| 2011/0094565 A1* | 4/2011 | Banin ................ | A63B 21/0004 |
| | | | 136/246 |
| 2011/0132433 A1 | 6/2011 | Tanaka et al. | |
| 2011/0186040 A1 | 8/2011 | Liao | |
| 2012/0285507 A1* | 11/2012 | Rettger ............... | H01L 31/0547 |
| | | | 136/246 |
| 2012/0313569 A1* | 12/2012 | Curran .................... | F24J 2/523 |
| | | | 320/101 |

FOREIGN PATENT DOCUMENTS

| | | |
|---|---|---|
| EP | 1626140 A2 | 2/2006 |
| EP | 1632786 A1 | 3/2006 |
| EP | 1691145 A2 | 8/2006 |
| EP | 2136155 A1 | 12/2009 |
| EP | 2204675 A1 | 7/2010 |
| EP | 2147467 B1 | 2/2011 |
| EP | 2336836 A1 | 6/2011 |
| WO | WO2005119133 A1 | 12/2005 |
| WO | WO2008121335 A1 | 12/2005 |
| WO | WO2008008787 A2 | 1/2008 |
| WO | WO2008154521 A1 | 12/2008 |
| WO | WO2009048879 A2 | 4/2009 |
| WO | WO2009061493 A1 | 5/2009 |
| WO | WO2009152343 A1 | 12/2009 |
| WO | WO2010101468 A1 | 9/2010 |
| WO | WO2010103090 A2 | 9/2010 |

OTHER PUBLICATIONS

Aliman, et al., "Simplification of Sun Tracking Mode to Gain High Concentration Solar Energy," American Journal of Applied Sciences, 4 (3): (2007), pp. 171-175.

Aliman, et al., "Tracking Error Analysis of a Rotation-Elevation Mode Heliostat," American Journal of Applied Sciences, 4 (3): (2007), pp. 176-180.

Luque-Heredia, et al., "A PI Based Hybrid Sun Tracking Algorithm for Photovoltaic Concentration," European Photovoltaic, 2004, pp. 1-4.

King, D. L., "Photovoltaic Module and Array Performance Characterization Methods for All System Operating Conditions," presented at Proceeding of NREL/SNL Photovoltaics Program Review Meeting, Nov. 18-22, 1996, pp. 1-22.

(56) References Cited

OTHER PUBLICATIONS

Lee, et al., "Sun Tracking Systems: A Review," published May 20, 2009, pp. 1-16.

Cervantes, et al., "Sunspear Calibration Against Array Power Output for Tracking Accuracy Monitoring in Solar Concentration," presented at the 23rd European Photovoltaic Solar Energy Conference and Exhibition, Sep. 1-5, 2008, pp. 1-4.

Quemere, et al., "Automation of the Calibration Process in the Sundog STCU," presented at the 23rd European Photovoltaic Solar Energy Conference and Exhibition, Sep. 1-5, 2008, pp. 1-3.

Hakenjos, et al., "Field Performance of Flatcon High Concentration Photovoltaic Systems,", cited in Photovoltaic Specialists Conference, 2008, PVSC '08, 33rd IEEE, pp. 1-4.

Hakenjos A., Uhlig, R., "Trackers for CPV Applications—A New Approach," presented at ICSC-5 Palm Desert, Nov. 19, 2008, pp. 1-24.

Yoon, H. J., Banin, Y., "CPV: Refractive Primary Optics Based on All-Glass Lens," published in Interpv, Apr. 2011, pp. 58-63.

Sun & Wind Energy, "Tracking Systems: Higher Output, Higher Investment Costs," www.sunwindenergy.com, Apr. 2008, pp. 136-147.

Opel Inc., "Harnessing the Sun Through Concentration," www.opelsolar.com, Jun. 2011, 6 pages.

SolFocus Inc., "Seguidor SolFocus de doble eje SFT-70PV," www.solfocus.com, published at least as early as Jan. 11, 2011, 2 pages.

SolFocus Inc., "Concentrator PV System: TR-30-6150 Preliminary Data Sheet," www.solfocus.com, published at least as early as Jan. 11, 2011, 4 pages.

Solergy Brochure—Realizing the Full Potential of Our Sun, Solergy Inc., www.solergyinc.com, (2007), 4 pages.

Solergy Inc., "BICPV Building Integrated Cogen CPV," www.solergyinc.com, May 2011, 2 pages.

\* cited by examiner

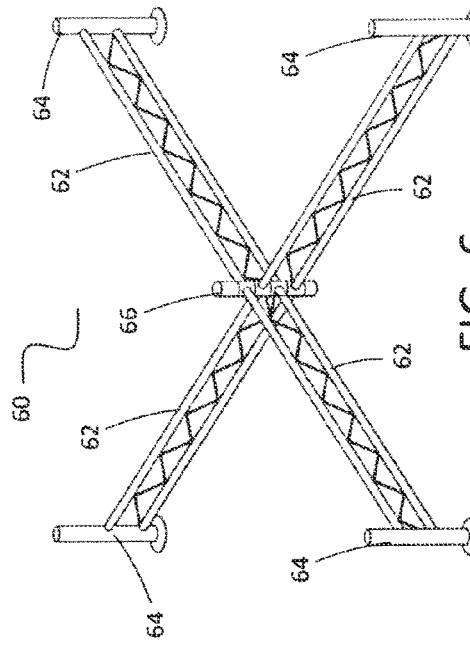
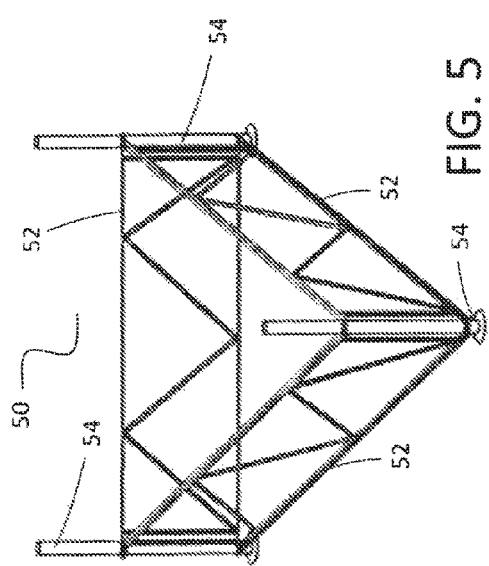
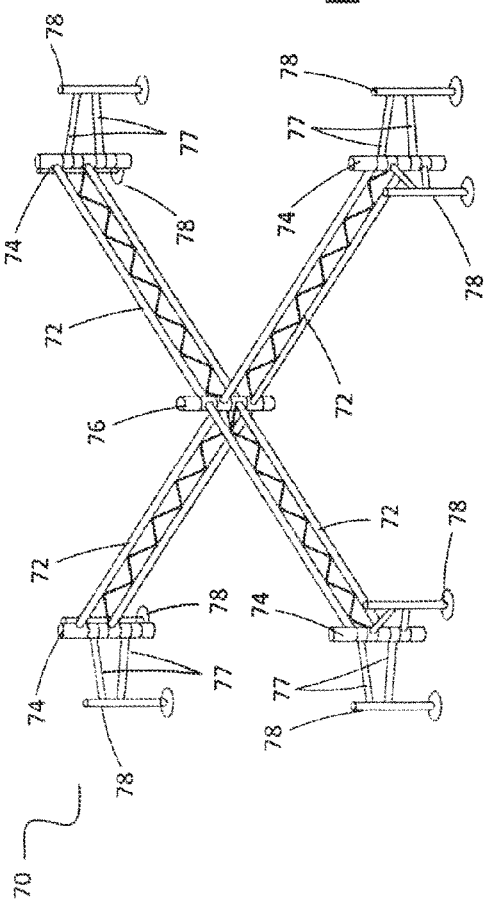

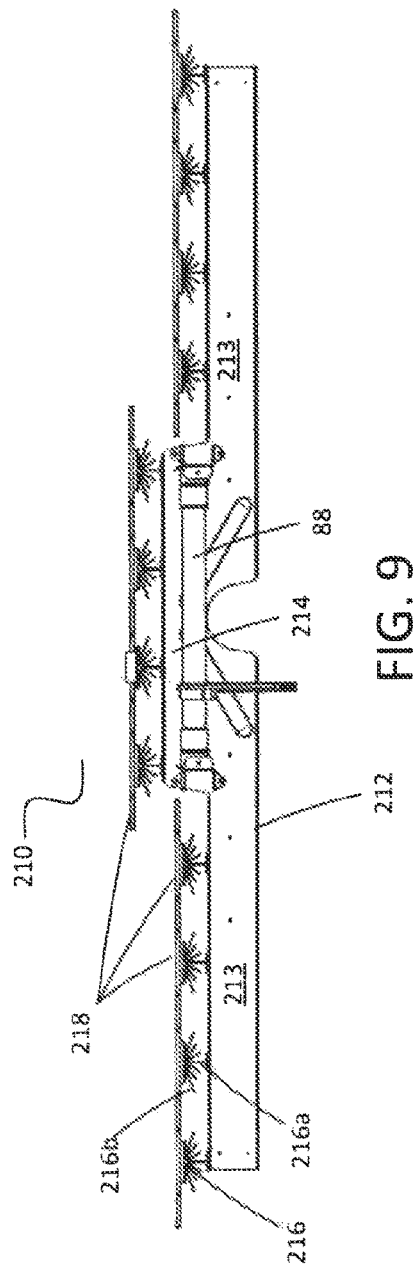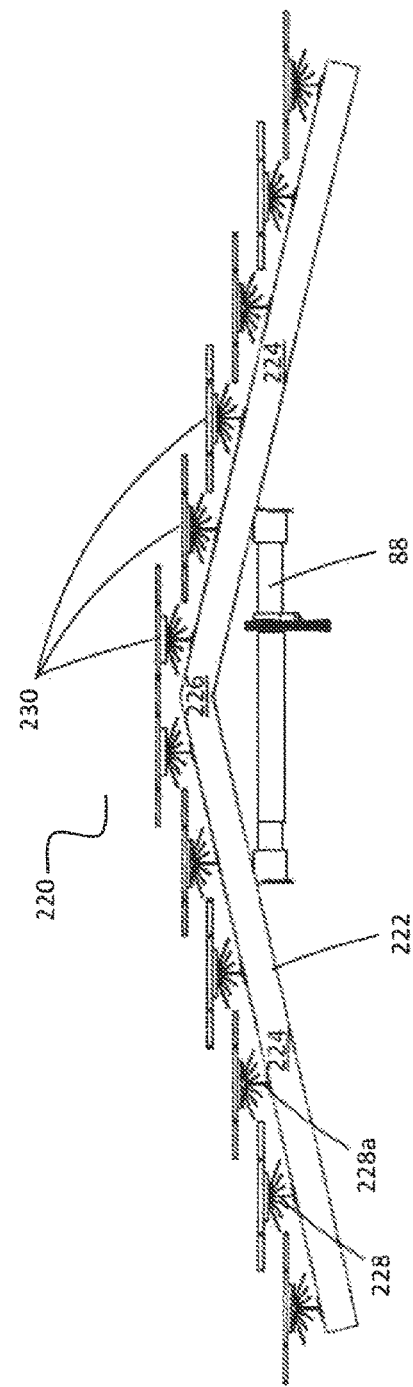

SELF-BALLASTED APPARATUS FOR SOLAR TRACKING

REFERENCE TO PRIOR APPLICATIONS

This application is a continuation of U.S. patent application Ser. No. 13/962,566 filed Aug. 8, 2013, which is a continuation of International Application No. PCT/IB2012/052723 filed May 30, 2012 designating the United States, which claims priority to U.S. Provisional Applications Nos. 61/523,817 filed Aug. 15, 2011 and to 61/532,083 filed Sep. 7, 2011, the entireties of all of which are incorporated herein by reference.

TECHNICAL FIELD

The present disclosure relates to the field of solar energy, and in particular to tracking solar panel assemblies, and arrangements thereof.

DESCRIPTION OF THE RELATED ART

Solar power is typically captured for the purpose of electrical power production by an interconnected assembly of photovoltaic (PV) cells arranged over a large surface area of one or more solar panels. Multiple solar panels may be arranged in arrays.

In addition to the difficulties inherent in developing efficient solar panels capable of optimum performance—including inconsistencies in manufacturing and inaccuracies in assembly—field conditions pose a further obstacle to cost-effective implementation of solar energy collection. Conventionally, solar tracker systems, which include a tracker controller to direct the positioning of the solar panels, benefit from mounting on a flat surface permitting accurate mounting of the system and ensuring stability by anchoring the system to a secure foundation, for example by pouring a concrete foundation. These requirements, however, add to the cost of field installation because of the additional equipment and manpower requirements.

BRIEF DESCRIPTION OF THE DRAWINGS

In drawings which illustrate by way of example only select embodiments that are described herein.

FIGS. 5, 6 and 7 are perspective views of alternate frame configurations;

FIGS. 9 and 10 are side elevations of example solar panels for use with the assembly of FIG. 1;

DETAILED DESCRIPTION

A self-ballasted solar tracker assembly is provided for concentrated or non-concentrated photovoltaic solar panels to maintain stability and alignment of the panels without requiring ground preparation. A modular, collapsible truss structure is provided as a frame to support a plurality of solar tracking units on which solar panels may be mounted. These individual panels are mounted at or near their center of gravity and positioned at corners or junctions of the frame. These structures are physically interconnectible in the field for enhanced stability, thus reducing or eliminating the need for ballast (such as concrete blocks), and also for the purpose of facilitating electrical connection and data communication. Arrangement of a plurality of these interconnected structures in a solar farm or sub-farm provides for efficiency in grounding the supporting structures of the solar tracking units.

Figure 1:
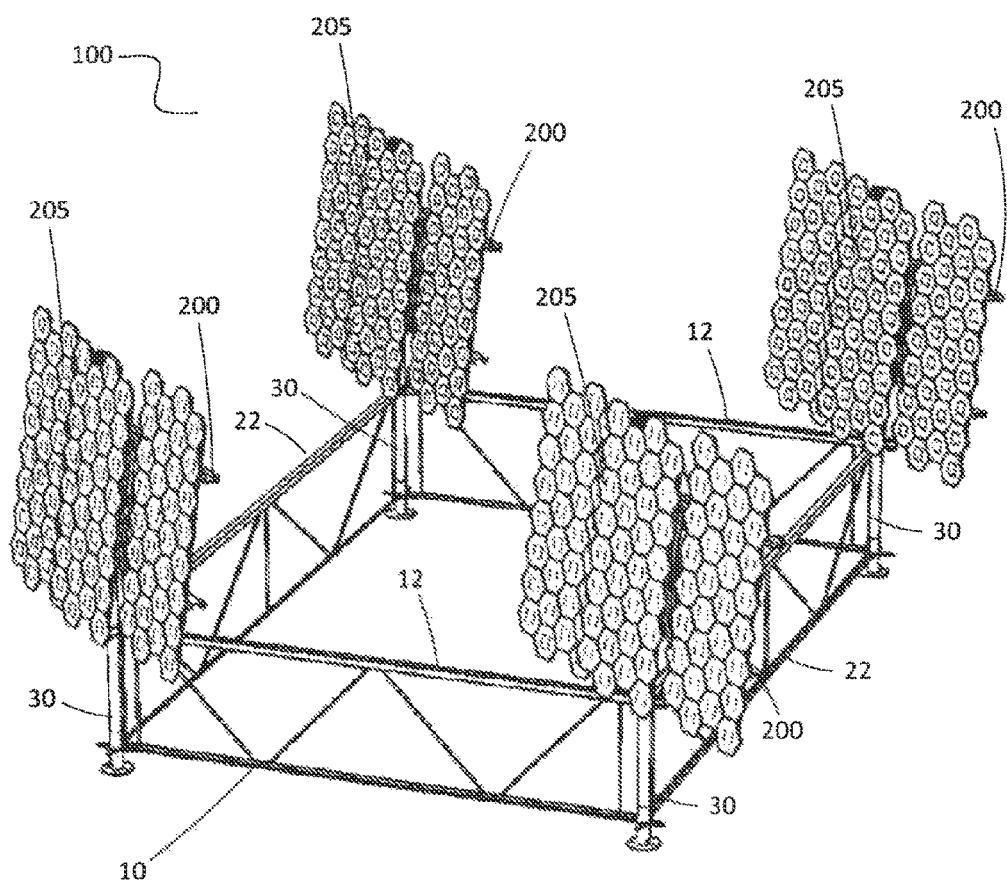
FIG. 1 is a perspective view of a ground-based tracking solar panel assembly.

Turning to FIG. 1, a perspective view of a solar tracker assembly or unit 100 is shown. The assembly 100 generally includes a ground-mounted frame 10 for supporting one or more photovoltaic (PV) tracker modules (also referred to as solar tracking units) 200. In the example illustrated in FIG. 1, the solar tracking units 200 are shown supporting solar panels 205. The frame 10 includes a plurality of trusses 12, 22. In the example of FIG. 1, the frame 10 has a first pair of trusses 12, 12 of substantially equal length defining first opposing sides of the frame 10, joined to a second pair of trusses 22, 22 also of substantially equal length defining the remaining opposing sides via leg assemblies 30. The assembly of the trusses thus yields an overall parallelogrammatic, and in this specific example, a box or rectangular frame 10. The sides of the frame 10 need not employ trusses specifically, although the benefits of the structural stability of a truss design will be appreciated by those skilled in the art.

Figure 2:
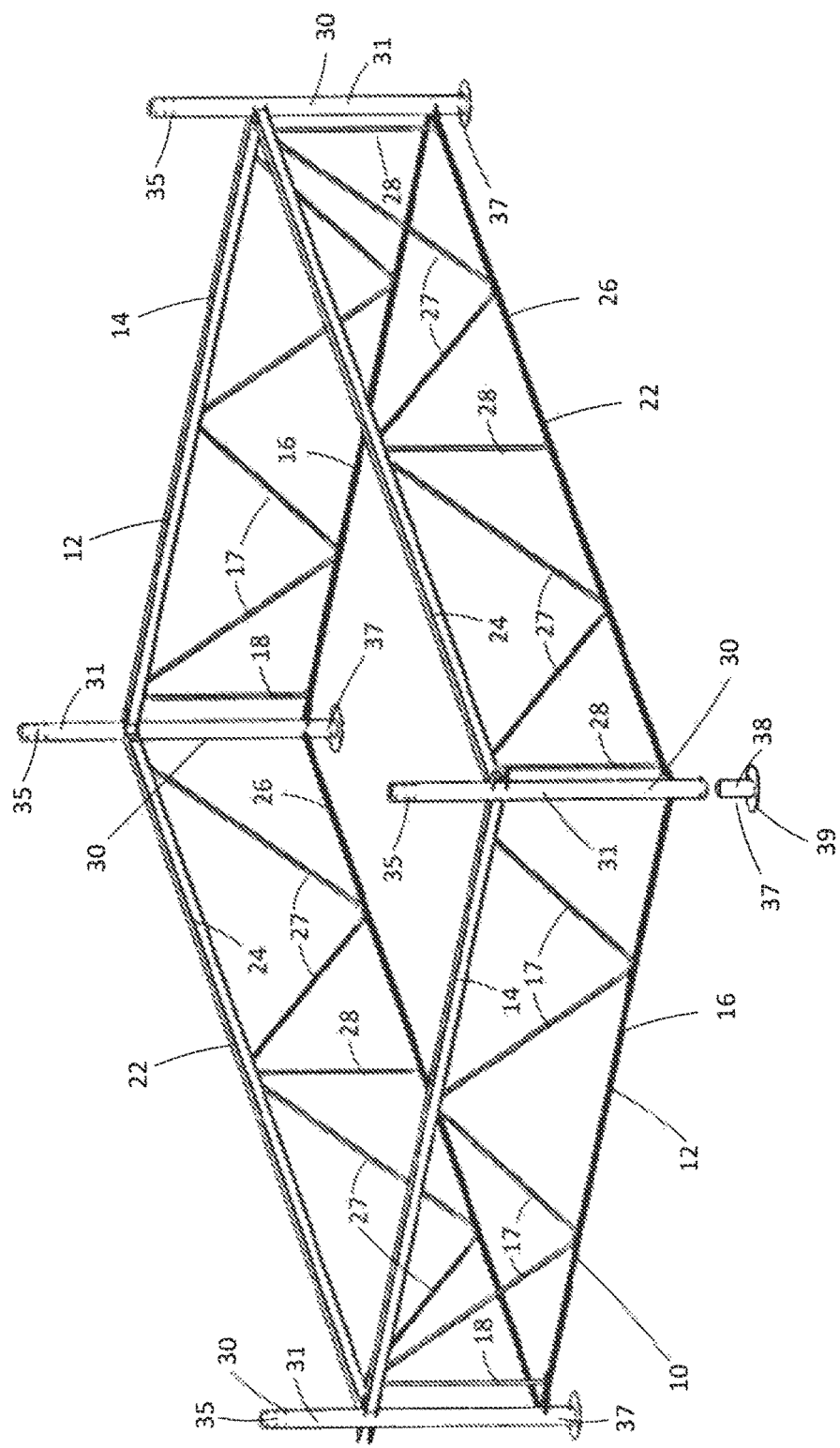
FIG. 2 is a perspective, partially exploded view of a box frame portion of the assembly of FIG. 1 in a deployed state.

As shown in FIG. 2, each individual truss 12 includes an upper chord member 14 and lower chord member 16, and each individual truss 22 includes an upper chord member 24 and lower chord member 26. The chord members 14, 16 and 24, 26 are joined by a set of truss members 17, 27 respectively. Trusses 12, 22 in this example each include a set of four truss members 17, 27. The selection and arrangement of the truss members 17, 27 need not be limited to the example shown; depending on the selected dimensions and materials of the frame 10, more or fewer truss members 17, 27 may be employed. In addition, one or more struts 18, 28 may be mounted between the upper and lower chord members 14, 16 or 24, 26 to provide additional vertical support between the chord members. In the example of FIG. 2, some struts 18, 28 are provided near the ends of the trusses 12, 22, i.e., near the joints between adjacent trusses. The number (which may be zero or more) and arrangement of struts, as well as the number and arrangement of truss members, can be selected according to the specific requirements for the solar tracker assembly 100 installation, as well as inherent characteristics of the frame 10 and the tracker modules 200, including the weight of the tracker modules 200 to be supported, material used to fabricate the trusses 12, 22 and the geometry of the trusses 12, 22.

The trusses 12, 22 are joined at or near their respective ends at leg assemblies 30, shown in further detail in FIGS.

3 and 4. Each leg assembly 30 includes a shaft 31, and can include an adjustable foot member 37, as shown in one example of the leg assembly as illustrated in FIG. 2. The foot member 37 in this example is detachable and includes a plate member 39 extending from a stem 38. The stem 38 is attached to the shaft 31 of the leg assembly 30, and in some examples the attachment point of the stem 38 to the shaft 31 may be varied so as to permit adjustment of the overall height of the leg assembly 30, and thus of the solar tracking units 200 when mounted thereon. The stem 38 and plate member 39 may have alternate configurations than that described herein. In some examples, a spike member or other attachment component, not shown, for anchoring the leg assembly in the ground and/or electrically grounding the frame 10 can be provided in addition to or instead of plate member 39. A distal end of the leg assembly 30 provides a mounting end 35 for mounting an armature assembly bearing the solar tracking module 200.

The trusses 12, 22 and leg assemblies 30, and their respective components, may be manufactured from any suitable material. For example, the trusses and leg assemblies may be manufactured from galvanized steel or aluminum, and may be manufactured from extruded or drawn metal tubing, whether open or seamed. Further, in some examples, at least the upper chord members 14, 24 may be provided with an axial borehole or otherwise formed with an interior channel running the length of the chord member, open at either end (not shown), which is conveniently provided when the chord members are manufactured from tubing. Cables, wires and hoses, such as electrical cables and the like, as well as air or water hoses, may be threaded through the upper chord members 14, 24 and/or lower chord members 16, 26. Similarly, the leg assembly 30 may be provided with a similar axial borehole or interior channel. In the examples illustrated herein, the leg assembly 30 is a tubular member.

Figure 3:
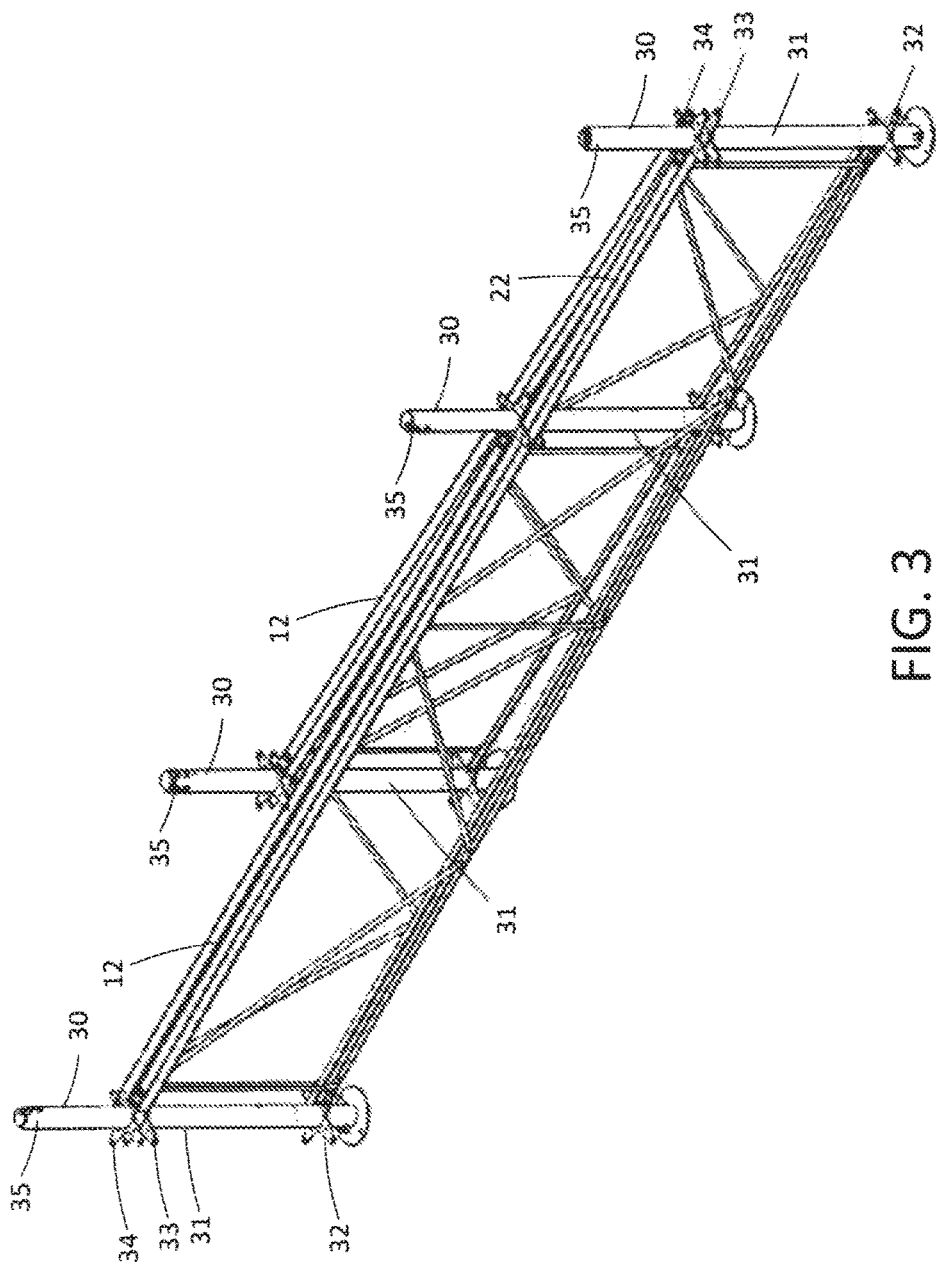
FIG. 3 is a perspective view of a portion of the box frame of FIG. 2 in a collapsed state.
Figure 4:
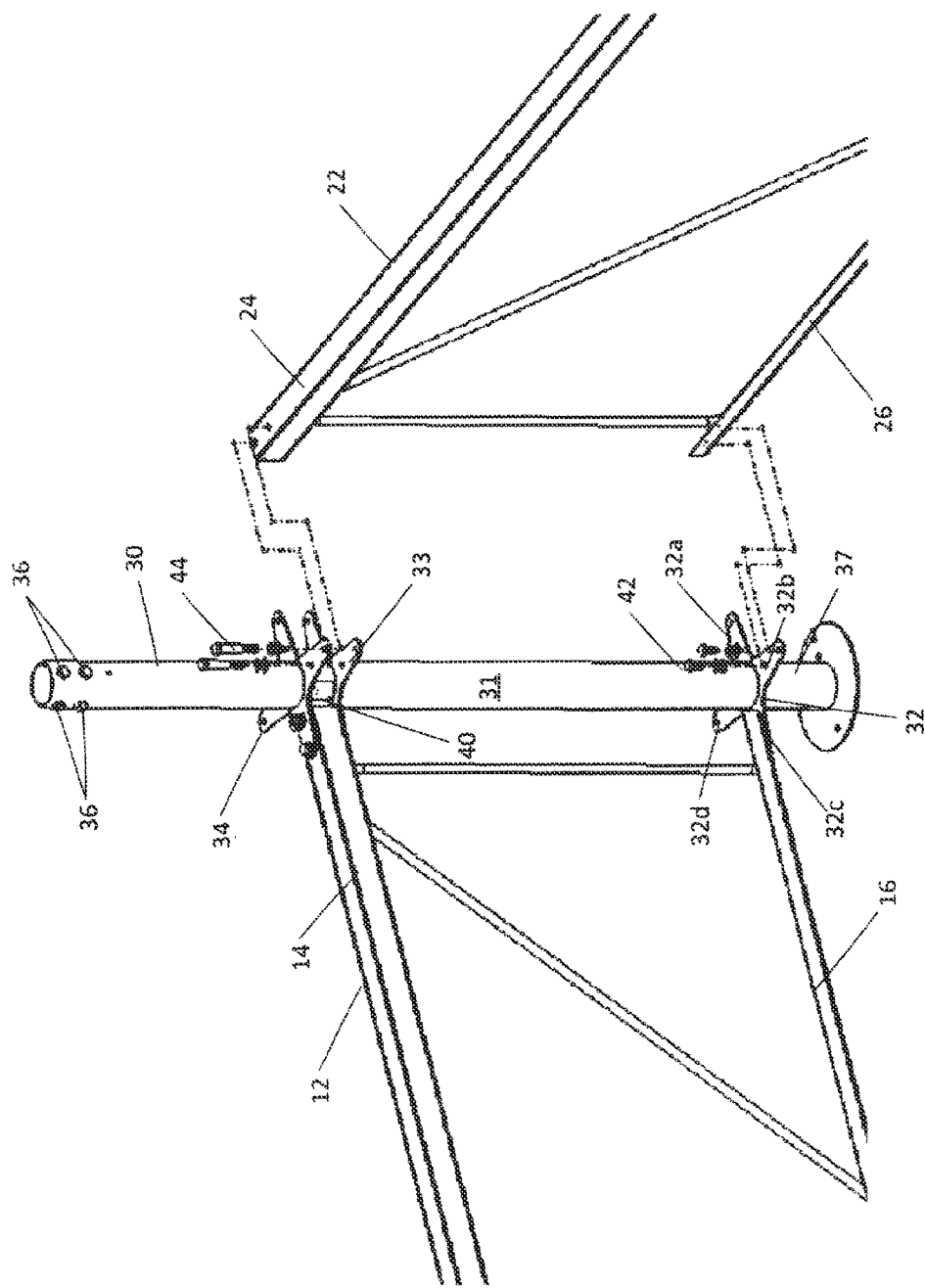
FIG. 4 is a perspective view of a leg assembly for mounting to a truss of the box frame of FIG. 2.

FIG. 3 illustrates three trusses 22, 12, 12 of the frame 10 joined to the four leg assemblies 30 illustrated in FIG. 2. In this example, the three trusses are assembled with the leg assemblies 30 in a collapsed state suitable for transportation. In this configuration, the trusses remain joined, but more easily transportable than when the frame 10 is completely assembled. The remaining fourth truss 22 may be provided separately. It will be appreciated, however, that even with the fourth truss connected in the frame 10, the frame 10 may still be collapsed to a substantially flat, folded structure suitable for transport. This view illustrates flange units 32, 33, 34 on the leg assemblies 30, which are provided for mounting the trusses 12, 22. It can be seen from the collapsed state that the fastening means used to join the trusses 12, 22 to the leg assemblies 30, shown in FIG. 4, are advantageously adapted to provide a hinged connection between each truss 12, 22 and the leg assembly 30 to permit the frame 10 to be shipped in a partially assembled state. Further, since the trusses 12, 22 may carry cables, wires or hoses in their respective upper or lower chords 14, 16, 24, 26, these components may be pre-threaded through the chords prior to shipping to minimize assembly time in the field, as well as shield the wiring, etc. from the elements, and reducing the need for expensive connectors.

Turning to FIG. 4, a further view of the leg assembly 30 is shown. A first, lower flange unit 32 is provided near a first end (i.e., near the end joined to the foot member 37) of the leg assembly. The flange unit 32 in this example comprises a set of four flanges 32a, 32b, 32c, 32d extending from the leg assembly. In this example of a box frame 10, the flanges 32a, 32b, 32c, 32d extend radially and are substantially equally spaced around the leg assembly 30, i.e., at right angles to one another. In this example, the individual flanges 32a, 32b, 32c, 32d and the lower chord members 16, 26 are provided with corresponding boreholes for receiving fasteners 42. The lower chord member 16, 26 is placed on the corresponding flange 32c, 32b such that the boreholes provided in each component are substantially aligned, and the fasteners 42 are used to join the chord member to its respective flange. The fasteners 42 may also facilitate an electrical connection between the chord member and the leg assembly 30 via its respective flange for electrical grounding purposes. Suitable fasteners 42 may be selected for joining and/or electrically connecting the chord members and flanges, such as the illustrated threaded bolts and washers. The fasteners mentioned herein may, for example, be self-tapping screws or split pins; thus the boreholes in the flange unit 32 and trusses 12, 22 need not be threaded.

It will be appreciated that other means of attaching a truss 12, 22 to the leg assembly 30 may be used; for example, the leg assembly 30 need not be provided with the flange units 32, 33, 34, but instead the upper and lower chords 14, 24, 16, 26 may be directly mounted onto the shaft. The individual flanges 32b, 32c, however, also provide support to the lower chord member 26, 16 of the truss 22, 12 mounted thereon. Although as illustrated in FIG. 4, the flange units 32, 33, 34 are shown fixed in predetermined positions on the shaft 31 of the leg assembly 30, in some examples the flange units 32, 33, 34 may be mounted on the shaft 31 at different heights of the shaft 31. The flange unit 32, for example, may comprise a tubular body with the flanges 32a, 32b, 32c, 32d extending therefrom, the tubular body having inner dimensions greater than the outer dimensions of the shaft 31. If the shaft 31 and tubular body of the flange unit 32 are circular, the flange unit 32 may be rotated to the desired orientation. The flange unit 32 may be slid along the length of the shaft 31 then fixed in position using appropriate fasteners. To simplify field installation, however, the flange units are fixed at predetermined positions.

Once the frame 10 is assembled, two of the flanges 32a, 32d in this example are not used to join any truss 12 or 22. However, it will be appreciated that providing the additional flanges 32a, 32d permits the leg assembly 30 to be joined to additional trusses (not shown), and to spacing arms, described below with reference to FIG. 13.

The upper flange units 33, 34 may be configured in a manner similar to the lower flange unit 32 described above. The upper flange units 33, 34 are spaced from the lower flange unit 32 on the shaft 31 to receive the upper chord members 14, 24 of the trusses 12, 22, again, in a similar manner to the lower flange unit 32. In this example, the upper chord members 14, 24 are disposed between the first flange unit 33, which supports the chord member, and the second flange unit 34. Fasteners 44 are then used to secure the chord member 14, 24 between the two flanges.

One or more of the leg assemblies 30 can include one or more ports 40 positioned at or near a level of the upper chord member 14, 24 when the latter is mounted to the leg assembly. A single such port 40 is shown in FIG. 4. Cables, wires or hoses threaded through the chord member 14, 24 may extend into a first port 40 corresponding to the open end of a first upper chord member 14, and pass through the leg assembly 30 to emerge from a second port corresponding to the open end of the second upper chord member 24, through which the cable, wire or hose continues. Alternatively, some cables and wires can be threaded through the chord member 14, 24 while others are attached to the exterior of the chord member 14, 24. For example, where the chord member 24 is electrically grounded, low voltage controls cables can be threaded through the chord member 14, 24, while high voltage power and controls cables can be run along the exterior of the chord member 14, 24 in order to electrically isolate them. In another example, some cables and wires can be attached to one side of the chord member 14, 24 while others are attached to the other side of the chord member 14, 24 such that the chord member 14, 24 acts as an electrical isolator. In yet another example, cables and wires may be threaded through the leg assembly 30 and run underground where they can be electrically isolated. The leg assembly 30 may also include a separator to isolate high and low voltage cables within the leg assembly 30.

The box shape of the example frame 10 provides a sufficiently stable configuration for mounting of solar tracking units 200. However, those skilled in the art will appreciate that alternative frame configurations are possible. An example of a triangular frame 50 is shown in FIG. 5, in which three trusses 52 are mounted to leg assemblies 54. In this particular configuration, the trusses 52 are substantially the same length, thus yielding a substantially equilateral triangle configuration; however, the trusses 52 may include two or three different lengths. The trusses 52 and leg assemblies 54 may be joined in a manner similar to that described in relation to FIG. 4, although unlike the example of FIG. 4, the flanges extending from the leg assemblies 54 will be arranged at angles suitable for joining the trusses in the desired triangular configuration.

Two other possible configurations are shown in FIGS. 6 and 7. FIG. 6 is a schematic representation of an X-configuration for a frame 60, with four trusses 62 mounted to a central support post 66 at a central point, and four leg assemblies 64 joined to a distal end of each truss 62. Solar tracking units, not shown, would then be mounted at least on one of the leg assemblies 64. The arrangement of the solar tracking units is thus similar to the arrangement of the solar tracking units 200 on the box frame 10 of FIG. 1. FIG. 7 shows a further X-configuration in which the trusses 72 again are mounted to a central support post 76, and extend in a similar arrangement to that shown in FIG. 6; however, the distal end of each truss 72 is mounted at a distal support post 74, and two leg assemblies 78 are joined to each of the distal support posts 74 by means of support beams 77 or a further truss. As in the example of FIG. 6, the frame 70 can support at least four solar tracking units (not shown), which can be mounted on the distal support posts 74. The examples shown in FIGS. 6 and 7 can be collapsed to facilitate transportation. The central support posts 66, 76 are provided with hinged connections, such that the trusses 62, 72 can be rotated. The distal support posts 74 of FIG. 7 are also provided with hinges, such that the leg assemblies 78 can be collapsed.

In the example illustrated in FIG. 1, the solar tracking units 200 are mounted on a mounting end 35 of the leg assemblies 30. The solar tracking unit 200 includes an armature assembly 80, shown in FIG. 8. A solar panel, such as those described in further detail below with reference to FIGS. 9 and 10, may be mounted on each of the armature assemblies 80. Each solar tracking unit 200 can also be provided with a sun position sensor (not shown) for use in computerized calibration to ensure that sunlight is normally incident on the surface of the solar panel, and to compensate for the vagaries of the field installation such as uneven terrain affecting the pitch of a given unit 200, and other issues such as manufacturing errors in the manufacture of the solar panel 210, 220 or its components, differences between the actual sun position and expected sun position, and the like.

Figure 8:
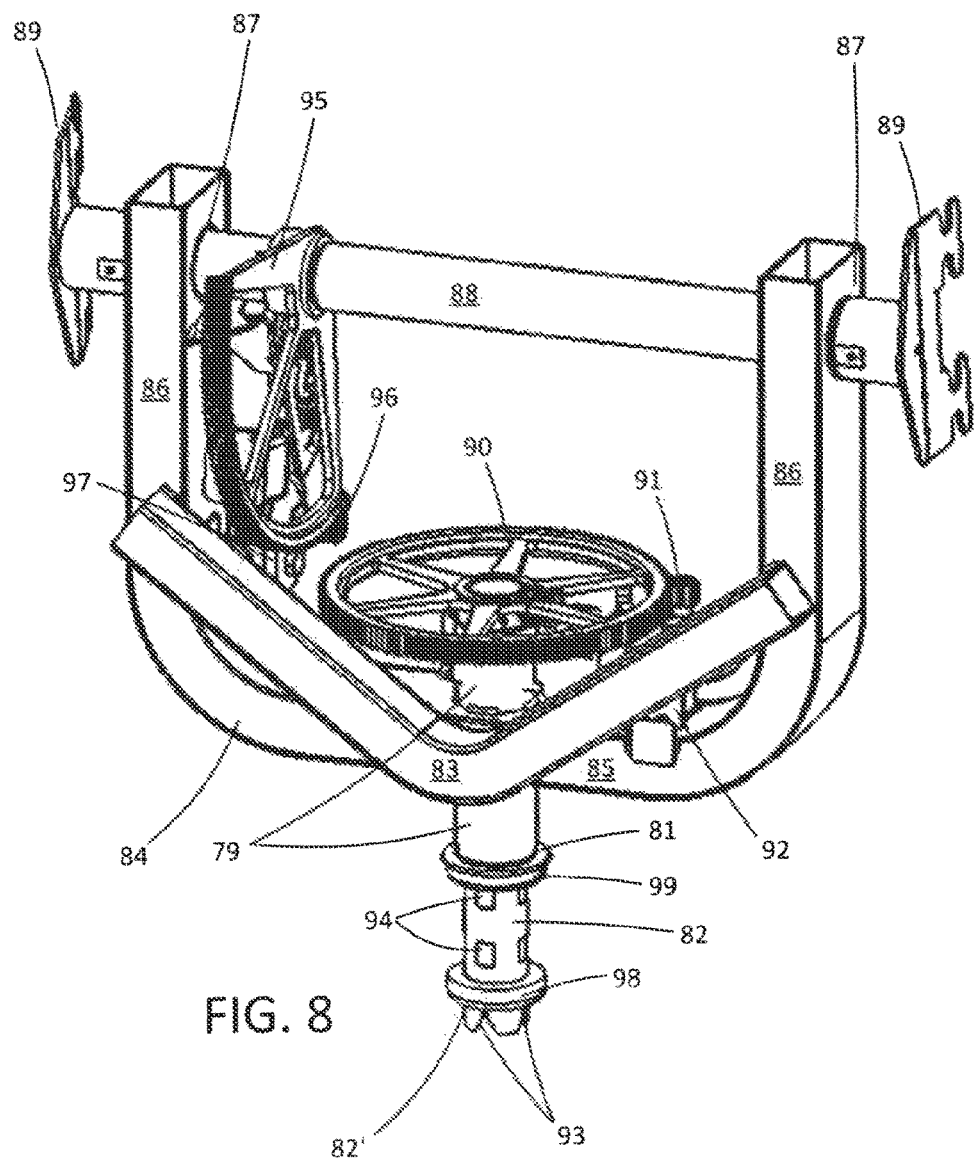
FIG. 8 is a perspective view of an armature assembly for use with the assembly of FIG. 1.

The armature assembly 80 includes a shaft 82 having an external diameter sized to fit within the mounting end 35 of the leg assembly 30. The orientation of the shaft 82 within the leg assembly 30 may be determined during field installation, but generally the orientation will be determined by the desired north-south alignment of the frame 10 and the solar tracking units 200. Alignment of the solar tracking unit 200 on the frame 10 can be set by one or more notches or embrasures 93 at the first end of the shaft 82', which receive one or more corresponding protrusions or pins (not shown) within the mounting end 35 of the leg assembly 30. In the example of FIG. 8, a first collar 98 and a second collar 99 are provided on the shaft 82 set back from the first end 82'. Each of the first and second collar 98, 99 have an external diameter greater than the shaft 82 or first end 82', with the first collar 98 being sized to fit within the mounting end 35 of the leg assembly 30 (not shown in FIG. 8) with minimal or no clearance. The second collar 99 can have substantially the same external diameter as the first collar 98 so as to similarly fit within mounting end 35, with an upper lip 81 of greater diameter, which rests on the top edge of the mounting end 35 of the leg assembly 30 when mounted. Thus, the position of the lip 81 on the shaft 82, and in some examples the depth of the notches 93, determine the height of the armature assembly 80 once mounted on the leg assembly 30. In other examples, the entirety of the second collar 99 can have an external diameter greater than at least the internal diameter of the mounting end 35 of the leg assembly 30, and the lip 81 may be eliminated. The second collar 99 in that case would rest on the top edge of the mounting end 35. When mounted, the shaft 82 can be further secured to the mounting end 35 with flats 94 or other receptacles (for example, bores or other apertures) adapted to receive fasteners (for example, set screws, not shown) provided in the mounting end 35. In some examples, bores 36 (shown in FIG. 4) are provided in the mounting end 35 for receiving the fasteners.

The armature assembly includes a yoke 84 provided with a yoke mount 79, a crosspiece 85 extending from the yoke mount 79, and first and second arms 86 extending from the crosspiece 85. In the configuration shown in FIG. 8, the arms 86 extend substantially perpendicularly from the crosspiece 85 and are substantially parallel to the yoke mount 79 and to each other, although in other configurations their relative position with respect to the crosspiece 85 and the yoke mount 79 may vary according to the design of the solar panel mounted on the armature assembly 80. A gusset 83 for added rigidity is mounted on the crosspiece 85 and arms 86. The yoke mount 79 extends through and is fixed to the center of crosspiece 85. The yoke mount 79, the crosspiece 85, the arms 86 and the gusset 83 may be manufactured as individual components welded together to form the yoke 84. Alternatively, the yoke 84 may be integrally formed as a single part by die casting.

A bearing or bushing, not shown in FIG. 8, may be provided within the yoke mount 79 to facilitate rotation of the yoke 84 about shaft 82. A first drive system for controlling yaw movement of the solar tracking unit 200 includes a first gear wheel 90 fixed to the shaft 82, and therefore stationary relative to the frame 10. A second gear wheel 91 in engagement with the first gear wheel 90 is also provided on the crosspiece 85, extending from the same face of the crosspiece 85 as the first gear wheel 90. The second gear wheel 91 is fixed relative to the yoke 84. In the example of FIG. 8, the first and second gear wheels 90, 91 are disposed on the inside of the yoke 84, i.e., between the arms 86. A first drive assembly including a motor and gearbox 92 is provided for the second gear wheel 91 for controlling rotation of the second gear wheel 91 to cause the yoke 84 to rotate around the fixed first gear wheel 90 and the shaft 82. An example of a suitable drive assembly includes a weatherproof and durable stepper motor having an output shaft connected to a sealed gearbox that has an output shaft with a pinion gear (the second gear wheel 91). The pinion gear (the second gear wheel 91) can therefore provide higher torque than the stepper motor, the increase in torque depending on the gear ratios of the gears contained inside the sealed gearbox. The pinion gear connected to the output shaft of the sealed gearbox engages the first gear wheel 90 and can operate in an unsealed environment. The first drive system thus provides for rotation of the yoke 84 up to 360 degrees (or greater) in a clockwise or counter-clockwise direction. In use, the armature assembly 80 may be enclosed in a weatherproof cover (not shown) to protect the drive systems from ice, rain, sand, etc.

An axle 88 is mounted through holes 87 provided near the ends of the two arms 86. Again, appropriate bearings or bushings may be provided, not shown. Each end of the axle 88 terminates in a plate 89 for mounting to an underside of a solar panel, shown in the following figures. The precise configuration of the plates 89 will depend on the attachment means used to mount the solar panel to the armature assembly 80; in this case, grooves are provided in the perimeter of the plate 89 to receive fasteners to join the armature assembly 80 to the solar panel. A second drive system controlling pitch of the solar tracking unit 200 is provided on the yoke 84 and axle 88; a first gear wheel 95 is mounted on the axle 88, and a second gear wheel 96 in engagement with the first gear wheel 95 is mounted on the yoke 84. In this example, the first gear wheel 95 is a circular sector wheel rather than a full circle like the gear wheel 90. Since yaw over a wider range (i.e., over 180 degrees) may be provided by the first drive assembly comprising the gear wheels 90, 91, pitch adjustment of the solar tracking unit 200 over a range of 90 degrees is likely sufficient. In other examples, the gear wheel 95 may be a semicircular shape rather than a quarter-wheel; depending on the proximity of the solar panel to the axle 88, it may not be possible to provide a full-circular gear wheel on the axle 88. The second gear wheel 96 is controlled by a further drive system including a motor and gearbox 97, also mounted on the yoke 84. An example of a suitable drive assembly includes a weatherproof and durable stepper motor having an output shaft connected to a sealed gearbox that has an output shaft with a pinion gear (the second gear wheel 96). The pinion gear (the second gear wheel 96) can therefore provide higher torque than the stepper motor, the increase in torque depending on the gear ratios of the gears contained inside the sealed gearbox. The pinion gear connected to the output shaft of the sealed gearbox engages the first gear wheel 95 and can operate in an unsealed environment In the example of FIG. 8, the motor 97 and second gear wheel 96 are mounted on the arm 86 proximate to the gear wheel 95.

In FIG. 8, spur gears are illustrated; however, other types of gears may be employed as well to provide motion in the two substantially orthogonal planes perpendicular to the shaft 82 and axle 88. Tension springs, not shown, may be provided to ensure engagement between the teeth of the gears 91, 96 and 90, 95. Home switches, not shown, may be provided on each of the two drive assemblies for use in returning the solar panels to a default position. Both the motors 92 and 97 are controllable using a local control unit described below.

The solar panel mounted to the armature assembly 80 may take any suitable shape. For example, the solar panel can include one or more flat plate solar panel modules made of semiconductors such as silicon, gallium arsenide, cadmium telluride, or copper indium gallium arsenide or can be a concentrated solar panel employing concentrating optics. In the case of concentrated solar panels, the solar panels include individual optical modules comprising PV cells. The optical modules may or may not include integrated electronics such as power efficiency optimizers and the like. Optics provided with the individual optical modules may include multiple-component optics. Embodiments of multiple-optic assemblies are described in United States Patent Application Publication Nos. 2011/0011449 filed 12 Feb. 2010 and 2008/0271776 filed 1 May 2008. An integrated concentrating PV module is described in United States Patent Application Publication No. 2011/0273020 filed 1 Apr. 2011. The entireties of the documents mentioned herein are incorporated herein by reference. The individual optical modules may be combined in series in strings of optical modules, which in turn may be connected in parallel with other strings to yield an array of optical modules. One or more strings of optical modules can be arranged in a plane to form a solar panel module.

FIG. 9 illustrates a first solar panel 210 in a "podium" configuration, in which solar panel modules of optical modules are arranged in a staggered formation to define a two-level panel. Strings of optical modules are mounted on one or more crosspieces 212 to form the solar panel modules. The crosspieces 212 may be manufactured from aluminum or any suitable material providing the weather resistance, rigidity and stability required for field use. The crosspiece 212 defines at least one recessed level 213 and at least one raised level 214, each bearing a plurality of optical modules 218. The crosspiece 212 in FIG. 9 comprises a single raised level 214 between two recessed levels 213; however, multiple raised levels 214 may be interleaved between multiple recessed levels. In this example, the optical modules 218 are mounted on heat sinks 216 which space the optical modules 218 from the crosspiece 212. Heat sinks may be manufactured from any suitable material; in FIG. 9, the heat sinks 216 are manufactured from extruded aluminum, and have an "I" beam configuration including a support 216a, which is mounted to the crosspiece 212 such that the optical modules 218 are substantially parallel to the level 213, 214, and the set of optical modules on a given level 213, 214 are substantially flush with one another. A series of fins 216b are provided to dissipate heat. Multiple crosspieces 212 to which the optical module strings are fixed are themselves connected by beams 215, shown in FIGS. 11 and 12, to which the armature assembly 80 can be attached.

An alternative "delta" solar panel configuration 220 is shown in FIG. 10. In this example, the crosspiece 222 comprises two arms 224 angled and meeting at a central apex 226. Again, the optical modules 230 are mounted to heat sinks 228, which in turn are mounted to the arms 224 at supports 228a. While, as mentioned above with respect to FIG. 9, the heat sinks may take a different form, the modified "I" beam form shown in FIG. 10 permits the individual optical modules 230 to be mounted parallel to each other in a terraced arrangement. Again, the armature assembly 80 can be mounted to beams, not shown in FIG. 10. Both these staggered and delta configurations 210, 220 thus offset adjacent strings of optical modules at different heights and consequently improve air flow around the panel, thus assisting in reducing wind loading and promoting thermal transfer from the heat sinks, and may allow the panels 210, 220 to operate at a somewhat higher efficiency than otherwise. A solar panel comprising a plurality of flat plate solar panel modules can likewise have a staggered or a delta configuration. In some examples, solar panel modules can be attached directly onto the at least one recessed level 213 and the at least one raised level 214 or onto the angled arms 224, without the need for heat sinks 216, 228.

Figure 11:
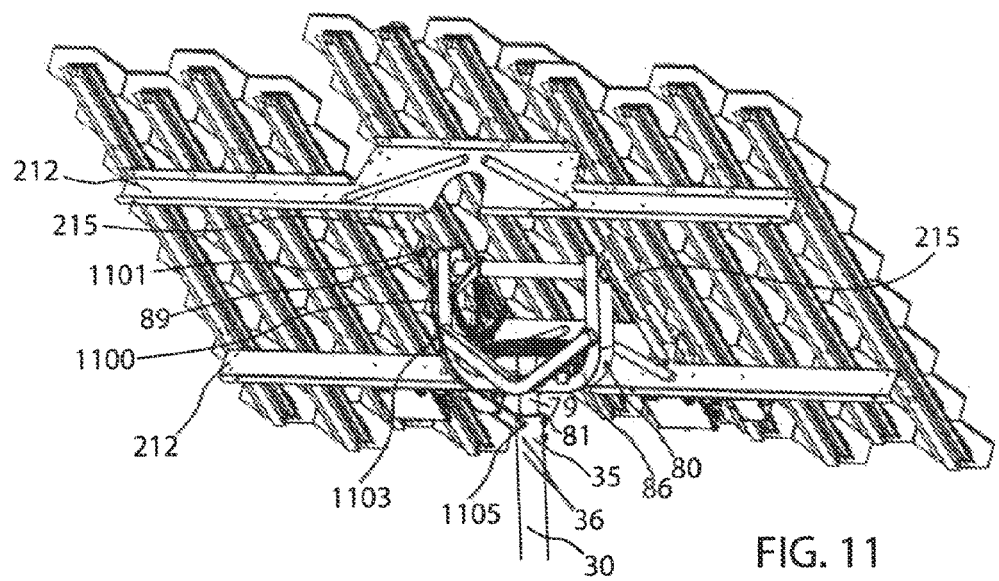
FIGS. 11 and 12 are perspective views of a mounted photovoltaic tracker module from the assembly of FIG. 1.

FIG. 11 illustrates the connection of the crosspieces 212 and beams 215 mentioned above. The plates 89 provided on the axle 88 of the armature assembly 80 may be fixed to the beams 215 using appropriate fastening means. The individual solar tracking units 200 and panels are usefully mounted with their center of gravity aligned with the position of the leg assembly 30 to enhance stability of the unit overall. The staggered and delta configurations of the solar panels 210 and 220 also enhance stability once installed; when the panels are mounted on the armature assembly 80, the axis of rotation (the pitch rotation, as defined by the axle 88) is substantially aligned with the center of gravity of the panel 210, 220 due to the arrangement of the offset adjacent strings of optical modules. This can be seen in FIGS. 9 and 10 by the position of the axle 88 with respect to the panel 210, 220. The panel design thus reduces the amount of energy required to drive the panel between different orientations, and assists in maintaining tracking accuracy.

Alternatively, the solar panel, whether a flat plate solar panel or a solar panel comprising concentrating optics, may have a "planar" solar panel configuration where all the receivers lie in one plane (not shown). If the center of gravity of the solar panel and panel frame used to mount the solar panel to the armature assembly is not at the center of the axle 88, then when the axle 88 is rotated, the center of gravity will be moved vertically against gravity requiring the system to do work. Therefore it can be advantageous to maintain the center of gravity of the solar panel and panel frame at the center of the axle 88. To maintain the center of gravity of the solar panel and panel frame at the center of the axle 88 a counterweight may be attached to the solar panel or panel frame to shift the center of gravity to the desired location (not shown).

FIG. 11 also illustrates a possible conduction path for grounding the supporting structures of the solar tracking units 200. A conductor 1100 is fixed at or near one end by a fastener 1101 to the beam 215, and extends to the fastener 1103 affixing the conductor 1100 to the gusset 83. A second end of the conductor 1100 is then fixed to the mounting end 35 of the leg assembly 30, for example at a further fastener 1105 joining the armature assembly 80 to the leg assembly 30. The conductor 1100 is fastened to the armature assembly 80 allowing enough slack to permit movement of the solar tracking unit 200 using the yaw and pitch drive assemblies. The conductor 1100 may be any suitable grounding wire or cable, such as insulated 10-gauge wire, and the fasteners any suitable type, and are advantageously self-tapping ground screws that are corrosive-resistant and paint-coated to resist degradation in field conditions.

Figure 12:
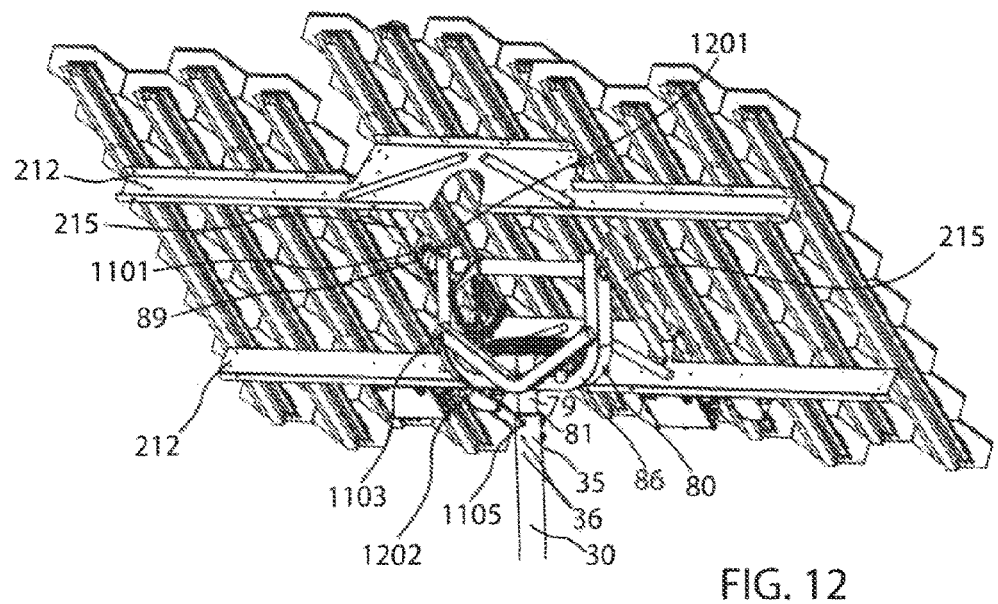

FIG. 12 illustrates an alternate wiring for grounding the supporting structures of the solar tracking unit 200. In this example, a first length of conductor 1201 is fixed between the fastener 1101 and a further fastener 1102 provided on the yoke arm 86. A second length of conductor 1202 is fastened to the gusset 83 using fastener 1103, and to the leg assembly 30 by the fastener 1105 on. In this manner, the yoke 84 and the gusset 83 provide part of the conductive grounding path, rather than relying on a longer length of cabling to provide the conductive path. In this manner, the amount of torsion and/or bending of the cable may be reduced, compared to the wiring of FIG. 11, since the conductor 1201, 1202 is subjected to less movement as the yaw and pitch drive assemblies move the solar tracking unit 200 along multiple axes.

Figure 13:
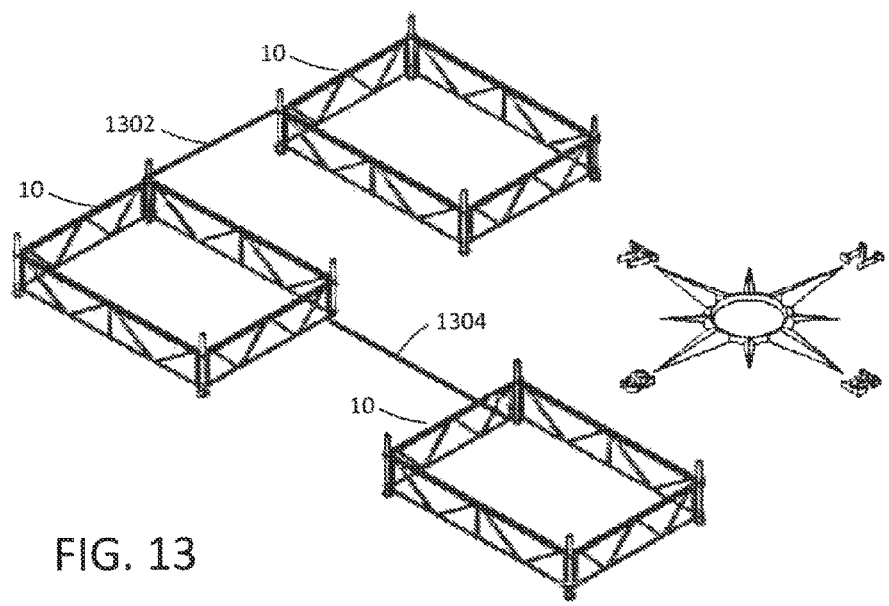
FIG. 13 is an illustration of an example of a plurality of interconnected frames.

When deployed in the field, box frames 10 are advantageously positioned so that one truss of the frame 10 is aligned in a north-south direction. An example of alignment and positioning is shown in FIG. 13, which depicts three box frames 10 as they may be arranged in the field with shorter trusses oriented in a north-south direction. To maintain spacing between the frames 10, spacing arms 1302, 1304 of predetermined length are fixed to trusses or leg assemblies of adjacent frames 10. Spacing arms 1302, 1304 may be aligned with upper chord members 14, 24 or along the ground. For example, as illustrated in FIG. 13, spacing arms 1302 oriented in the north-south direction can be aligned with upper chord members 14, 24 and spacing arms 1304 oriented in the east-west direction can be at or near ground level which can allow for people to move more easily between the frames 10 and, where spacing permits, for vehicles to be driven between the frames 10 in the east-west direction. The interconnection enhances the structural solidity of the frames 10 overall, and reduces the need for external ballasting of the frames 10. The lengths of the spacing arms 1302, 1304 and the dimensions of the frames 10 themselves are selected according to the desired spacing of individual solar tracking units 200, which can be based at least in part on the size of the solar panels and/or environmental considerations such as shading and wind speeds, and on manufacturing considerations, for example based on an analysis of the relative component, shipping and land use costs and optimal power production. For example, the distance between leg assemblies in the north-south direction may be approximately 3.44 m and the distance between leg assemblies in the east-west direction may be approximately 4.98 m where panels of the type shown in FIGS. 11 and 12 are used.

In addition to physical interconnection of frames 10 of the solar tracker assemblies 100 for the purpose of enhancing stability, the individual solar tracking units 200 are interconnected within a single solar tracker assembly 100. A local control unit 1402 (LCU), shown in FIG. 14, can be provided on each assembly 100 to control all solar units 200 provided on a single frame 10. Alternatively, a single LCU 1402 can be used to control the solar tracking units 200 on several frames (not shown). For example, a cluster of frames 10 could be positioned and arranged such that an LCU 1402 is mounted only to a single frame 10 of the cluster and the other frames 10 do not have local control units mounted thereto. Wires can be run from the single LCU 1402 to each of the solar tracking units 200 on the frames of the cluster. Within a given frame 10 having four solar tracking units 200, pairs of the units 200 may be connected in series with one another, and these pairs connected in parallel with one another, thus permitting increased voltage to reduce power losses in interconnecting wires. Each pair of units 200 can be provided with a current and/or voltage sensor (not shown) in communication with the LCU 1402. In some examples, individual solar tracking units 200 on a single frame are independently controllable and each solar tracking unit 200 can be provided with a current and/or voltage sensor.

The LCU 1402 can receive input including astronomical data (which may be pre-programmed in the LCU or alternatively received over a network), readings from the current or power sensors, and readings from the sun position sensors on each solar tracking unit 200. The LCU uses the input data to determine the solar panel position for each unit 200 and outputs signals to control the motor and to communicate with other components in the field or over a network. The LCU 1402 may also be provided with a temperature sensor to measure the ambient temperature at the assembly 100 site. If the temperature is detected to rise above a predetermined threshold, the LCU 1402 can stop tracking the sun until the temperature returns to an operational range (e.g., −20 to +50 degrees Celsius). If wind speed exceeds a predetermined threshold (e.g., over 35 mph), the LCU 1402 can output a signal to the motors 92, 97 to move the solar tracking units 200 into a horizontal "stowed" position. If no temperature (or wind speed) sensor is provided on the individual assembly 100, weather data may be provided to the LCU 1402 over a communication line from a central location in a solar farm in which the assembly 100 is located, or alternatively from another network source.

Figure 15:
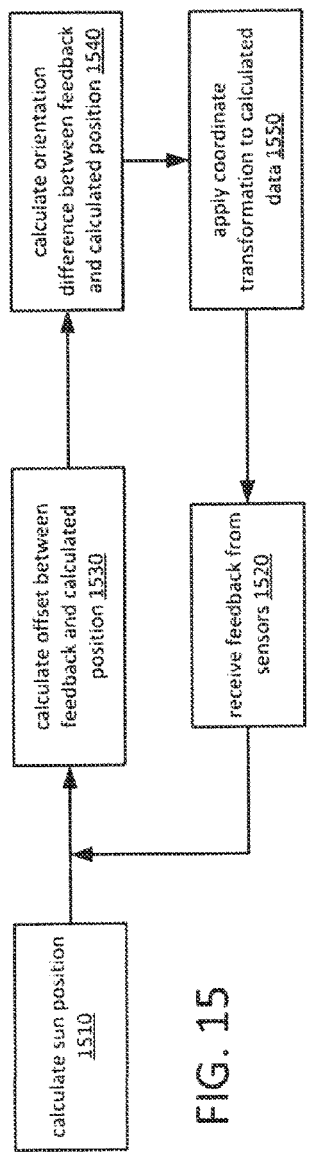
FIG. 15 is a flowchart illustrating a process for auto-calibration.

The LCU 1402 may self-calibrate its expected sun position determined from received astrological data by comparing feedback from the sun sensors or power sensor (i.e., current and/or voltage sensors) on each tracking unit 200 in the iterative process shown in FIG. 15. At 1510, an initial sun position is calculated by the LCU 1402. At 1520, feedback is received from the sun sensors, and at 1530 an offset is computed between the received sun sensor data and the calculated position. An orientation difference between the feedback position and the calculated position is determined at 1540, and at 1550 a coordinate transformation based on that determined difference is applied to the calculated position. As the LCU 1402 continues to receive feedback from the sensors at 1520, the transformation may be further adjusted. The transformation is then applied to other sun position calculations made by the LCU 1402 to control the position of the solar panels 210, 220 on the various solar tracking units 200. While the sun sensors on each solar tracking unit 200 thus may be used to compensate for factors such as uneven terrain or imperfect installation, misalignment of the sun sensor with respect to the individual panel 210, 220 in the unit 200 may result in continuous degraded performance. Accordingly, the LCU 1402 may additionally or alternatively track the mechanical maximum power point (MPP) for each panel or plurality of panels using the current and/or voltage sensors, and carry out calibration of the panels by incrementally adjusting the alignment of individual panels along each axis to determine an optimal position.

Figure 14:
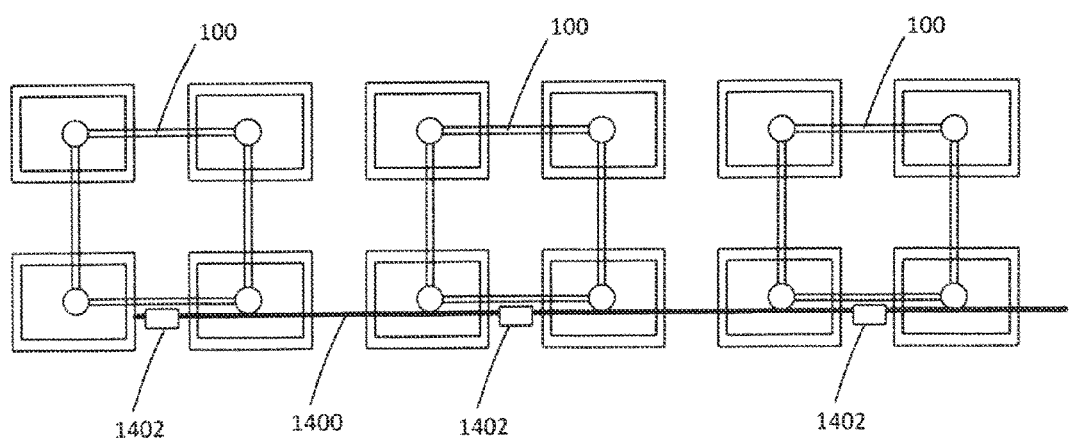
FIG. 14 is a schematic showing electrical and communication interconnections among a plurality of tracking solar panel assemblies of FIG. 1.

Multiple LCUs 1402 can be interconnected in the field by field wiring 1400, as shown in FIG. 14. The field wiring 1400 may include a power bus for the assemblies 100 as well as communication wiring for each of the LCUs 1402. In one example, power line communication is used to effect communication between the LCUs 1402 and a global control or supervisory unit, not shown, which receives data from each of the plurality of LCUs 1402 within a farm or sub-farm of assemblies 100. The global control unit may receive data such as sun sensor data, power or current readings for each individual tracking unit 200 pair or for the entire assembly 100, and may transmit data to the LCUs 1402 including motor control instructions and other operational data, such as astrological data. Control of individual solar tracking units 200 may also be effected from the global control unit, thus overriding the associated LCU 1402. For example, maintenance personnel may use the global control unit to force the solar tracking units 200 the stowed position or to another position for maintenance and repair, or to deactivate single solar tracking units 200. In other examples, wireless (RF) communication or wired serial communications may be used between the LCUs 1402 and the global control unit. The global control unit may also optionally be accessible by operators over a public or private network, such as the Internet, for remote control of the global control unit and of individual LCUs 1402. There is thus provided a network of independently operable solar tracking units 200, each of which may be controlled using a central control system.

Some or all of the LCUs 1402 can also be made so that they do not require field wiring. This can be achieved by using wireless (e.g., radio frequency) communication between the LCUs 1402 and the global control unit and by powering the LCUs 1402 either off the solar panels that the LCU is tracking or by powering each of the LCUs 1402 with one or more secondary solar panels that are connected directly to the LCU 1402 and do not contribute to the power conducted by the main power bus of the solar farm which conducts the power produced by the solar tracking units 200. The secondary solar panels can be integrated directly into the casing of the LCU 1402 (not shown).

The global control or supervisory unit can be integrated into one of the LCUs 1402 in a solar farm. Alternatively a smaller solar farm might need only a single LCU controlling multiple trackers and serving simultaneously as the LCU and the global control unit.

Figure 16:
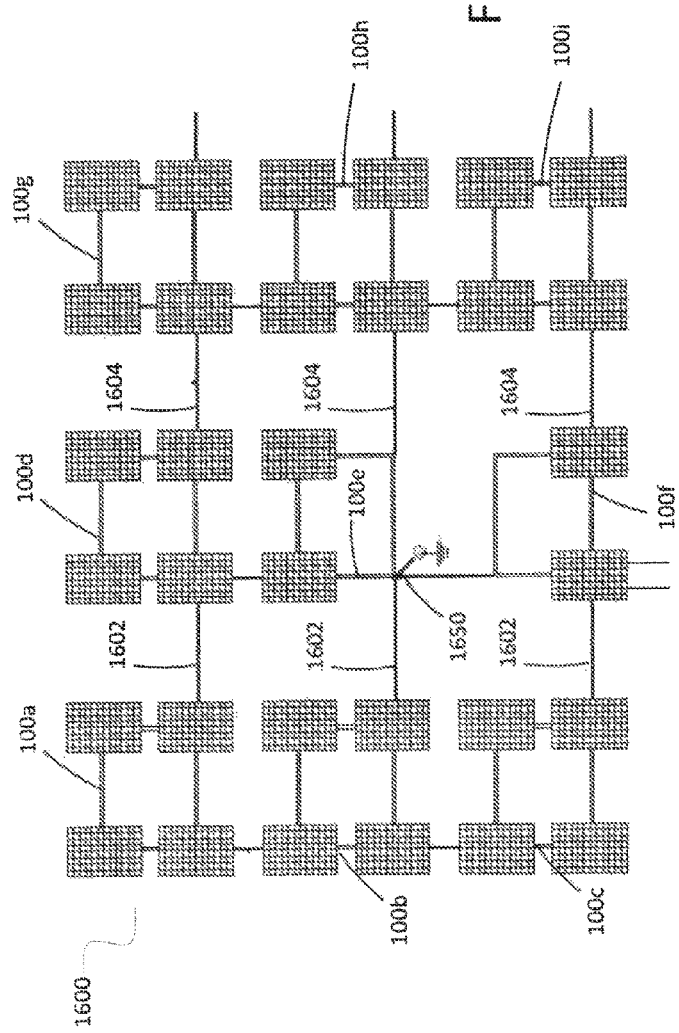
FIG. 16 is a further schematic showing electrical and communication interconnections among a plurality of tracking solar panel assemblies in a solar farm.

FIG. 16 illustrates an example layout of a solar sub-farm or assembly array 1600 using solar tracking assemblies 100a-100i as described herein. The array 1600 in FIG. 16 includes nine assemblies 100 set out in a grid formation, with columns of assemblies 100 connected by spacing arms 1602, 1604 and field wiring, which may follow the path of the spacing arms 1602, 1604. It can be seen that assemblies 100e and 100f do not include a full complement of solar tracking units 200.

Typically, when assemblies 100 are installed, the supporting structures of each solar tracking unit 200 is grounded using the conductive paths described above with respect to FIGS. 11 and 12. An earthing electrode such as a grounding rod or spike may be connected to each of the leg assemblies 30 to prevent the accumulation of undesired voltage on the frames 10 and the supporting structures (e.g. the crosspieces, beams and armature assembly) of the solar tracking units 200. To reduce cost of installation, since the spacing arms 1602, 1604 provide a conductive path between the units 200, a central grounding location for a grounding rod or spike 1650 connected to one of the frames 10 of the assembly array 1600 is selected in a position that provides the minimum possible path between the furthest individual solar tracking unit 200 within the array 1600 and the grounding spike 1650.

With the foregoing frame 10 and units 200, the solar tracker assemblies 100 are easily installed in the field. As mentioned above, various features of the assemblies 100 can compensate for uneven terrain; advantageously rough grading of the site is carried out to roughly level the ground, and to create paths for maintenance access. On unstable ground or fertile soil, a thin layer of crushed concrete aggregate may be distributed to assist in stabilizing the ground and/or prohibiting plant grown. The pre-wired, collapsed frame 10 having three trusses 12, 22 is unfolded, and the fourth truss 22, 12 fixed in place. The foot member 37 on each leg assembly 30 is adjusted, if necessary, to compensate for uneven terrain; however, this adjustment need not be completely accurate since variations in the terrain can also be compensated for by auto-calibration of the tracker modules. Armature assemblies 80 are then distributed to each leg assembly 30, and dropped into place on the mounting end 35 of the leg assembly 30, and fixed in place with a fastener. The solar panel 210, 220 is then fixed to the armature assembly 80 via the plates 89 and fasteners. The overall height of the frame 10 and armature assembly 80 is such that cranes or similar equipment are not necessary for installation of the panels 210, 220. In a further embodiment, the panels 210, 220 are shipped with removable handles that permit the installation personnel to lift the solar panel 210, 220 and to place it on the armature assembly 80.

Grounding wires are then attached as necessary, and the motors 92, 97 connected to wiring within the frame 10 leading to the local control unit 1402. The motor wiring may pass, in part, through the leg assemblies 30 and/or truss assemblies. The local control unit 1402 is mounted on the frame 10 and connected to the wiring already provided on the frame 10. The local control unit 1402 is then connected to the power bus interconnecting the other assemblies 100. Field wiring is provided by pre-cut and terminated bundles of PV-rated cabling containing the PV power bus and the local control unit power/communication bus. The field wiring may lie directly on the ground between solar tracker assemblies 100, although in those regions where it may interfere with maintenance paths between assemblies 100 it may be desirable to bury the cabling or otherwise protect it.

If air or water hosing is provided within the frame 10, this hosing is connected to a source. The hosing may be connected to cleaning implements (e.g., a spray gun) and used to clean the tracking solar module 200 or other components of the assembly 100.

Various embodiments of the present invention having been thus described in detail by way of example, it will be apparent to those skilled in the art that variations and modifications may be made without departing from the invention. The invention includes all such variations and modifications as fall within the scope of the appended claims.

The invention claimed is:

1. A system of solar tracking assemblies, the system comprising:
    a plurality of interconnected solar tracking assemblies, each solar tracking assembly comprising:
        a frame comprising a plurality of leg assemblies interconnected by a plurality of trusses, each leg assembly having a shaft with a mounting end;
        a plurality of armature assemblies adapted to provide movement around a plurality of axes, each one of the plurality of armature assemblies being mounted on a corresponding mounting end of one of the plurality of leg assemblies;
        at least one solar panel mounted on a corresponding one of the plurality of armature assemblies; and
        a local control unit mounted on the frame and in communication with the plurality of armature assemblies, the local control unit being adapted to control movement of the plurality of armature assemblies; and
    a global control unit in communication with each local control unit of each of the plurality of interconnected solar tracking assemblies, the global control unit being adapted to provide instructions for each local control unit and each of the armature assemblies in communication therewith,
    wherein the frames of adjacent solar tracking assemblies are connected to and spaced apart by one another in two directions by spacing arms, each spacing arm being connected at a first end to one of the plurality of leg assemblies of a first solar tracking assembly and at a second end to one of the plurality of leg assemblies of an adjacent solar tracking assembly, and
    wherein spacing arms in at least one of the two directions run proximate to the ground to permit passage between the frames of the adjacent solar tracking assemblies.

2. The system of claim 1, wherein each solar tracking assembly comprises at least one current sensor, and further wherein, for each solar tracking assembly, each local control unit controls movement of the plurality of armature assemblies based on at least one of received current sensor data from the at least one current sensor, a maximum power point, and sun position data.

3. The system of claim 2, wherein for each solar tracking assembly, the sun position data is obtained from a sun sensor separate from the at least one current sensor.

4. The system of claim 2, wherein the global control unit is adapted to transmit instructions to each local control unit to move the plurality of armature assemblies to a stowed position.

5. The system of claim 1, wherein each solar tracking assembly of the plurality of interconnected solar tracking assemblies, once assembled, is sufficiently ballasted by a weight of the frame without use of external ballast.

6. The system of claim 1, wherein each solar tracking assembly of the plurality of interconnected solar tracking assemblies, once assembled, is sufficiently ballasted by a weight of the frame and the plurality of armature assemblies without use of external ballast.

7. The system of claim 1, wherein the plurality of interconnected solar tracking assemblies, once assembled, is sufficiently ballasted by a weight of the plurality of leg assemblies.

8. The system of claim 1, wherein each leg assembly of each frame is directly anchored in the ground.

9. The system of claim 1, wherein each of the plurality of armature assemblies is adapted to provide rotation of the solar panel around two axes.

10. The system of claim 1, wherein each of the plurality of armature assemblies of each solar tracking assembly comprises:
    a yoke comprising:
        a yoke mount adapted for mounting on the shaft of the corresponding mounting end of said leg assembly, the yoke mount being rotatable on the shaft around a first axis defined by an axis of the shaft; and
        an axle mounted on the yoke mount, the axle being rotatable on the yoke mount around a second axis substantially perpendicular to the first axis;
    a first drive system adapted to control rotation of the yoke around the first axis; and
    a second drive system adapted to control rotation of the axle around the second axis.

11. The system of claim 10, wherein each solar panel comprises a plurality of solar panel modules mounted in offset relation to one another and mounted such that the axle is substantially aligned with a center of gravity of the solar panel.

12. The system of claim 11, wherein each solar tracking assembly comprises four solar panels mounted on a corresponding one of four armature assemblies, the four solar panels being electrically connected such that either:
    two solar panels are connected in series, or
    at least two solar panels are connected in parallel,
    wherein at least one of the four solar panels is provided with a current sensor.

13. The system of claim 1, wherein for each solar tracking assembly, each leg assembly further comprises an adjustable foot member for directly engaging the ground.

14. The system of claim 1, wherein for each solar tracking assembly,
   each of the trusses comprises an upper chord member, a lower chord member and a plurality of truss members attached therebetween for supporting and stabilizing the upper and lower chord members;
   each of the leg assemblies further comprise at least a first flange unit and a second flange unit, each flange unit comprising a plurality of flanges extending radially from a point along the length of the shaft, the first flange unit located at a point for alignment with the lower chord of at least one of the trusses and the second flange unit spaced apart from the first flange unit for alignment with the upper chord of at least one of the trusses, each flange comprising at least one aperture therethrough; and
   the frame further comprises a plurality of fasteners for hingedly connecting the trusses to the leg assemblies, each fastener connecting an upper chord or a lower chord of one of the trusses to an associated flange via the aperture of said flange.

15. The system of claim 14, wherein each solar tracking assembly further comprises at least one of a cable, a wire and a hose pre-threaded through at least one of an upper chord and a lower chord of at least one of the trusses.

16. The system of claim 1, wherein the frame of each solar tracking assembly comprises three leg assemblies interconnected in a triangular configuration.

17. The system of claim 1, wherein the frame of each solar tracking assembly comprises four leg assemblies interconnected in a box configuration.

18. The system of claim 1, wherein the frame of each solar tracking assembly comprises four leg assemblies interconnected by the plurality of trusses in an X configuration when viewed from above, each truss extending from an intersection of the X configuration and having a distal end connected to a corresponding one of the plurality of leg assemblies.

* * * * *